(12) United States Patent
Liu et al.

(10) Patent No.: US 7,830,659 B2
(45) Date of Patent: Nov. 9, 2010

(54) BLOCKING DEVICE ADAPTED IN A BLADE SERVER AND BLADE SERVER

(75) Inventors: Po-Chen Liu, Lujhou (TW); Chao-Jung Chen, Taipei (TW)

(73) Assignee: Quanta Computer Inc., Tao Yuan Shien (TW)

( * ) Notice: Subject to any disclaimer, the term of this patent is extended or adjusted under 35 U.S.C. 154(b) by 0 days.

(21) Appl. No.: 12/382,516

(22) Filed: Mar. 18, 2009

(65) Prior Publication Data

US 2010/0157521 A1 Jun. 24, 2010

(30) Foreign Application Priority Data

Dec. 24, 2008 (TW) ............................. 97223196 U

(51) Int. Cl.
*H05K 7/20* (2006.01)
(52) U.S. Cl. ..................... 361/690; 361/694; 361/695; 454/184
(58) Field of Classification Search ................. 361/690, 361/694, 695; 454/184
See application file for complete search history.

(56) References Cited

U.S. PATENT DOCUMENTS

| | | | |
|---|---|---|---|
| 6,542,363 B2* | 4/2003 | White .......................... | 361/695 |
| 6,771,499 B2* | 8/2004 | Crippen et al. ........... | 361/679.48 |
| 7,344,439 B2* | 3/2008 | Henry et al. .................. | 454/184 |
| 7,432,441 B2* | 10/2008 | Liang ............................ | 174/50 |
| 7,508,683 B1* | 3/2009 | Jochym et al. ................ | 361/818 |
| 7,646,601 B2* | 1/2010 | Zhang et al. .................. | 361/695 |
| 2007/0207720 A1* | 9/2007 | Henry et al. .................. | 454/184 |
| 2008/0160899 A1* | 7/2008 | Henry et al. .................. | 454/184 |
| 2008/0218969 A1* | 9/2008 | Muraki .......................... | 361/695 |
| 2009/0154114 A1* | 6/2009 | Peng et al. .................... | 361/728 |
| 2009/0161310 A1* | 6/2009 | Peng et al. .............. | 361/679.46 |

\* cited by examiner

*Primary Examiner*—Gregory D Thompson
(74) *Attorney, Agent, or Firm*—Rabin & Berdo, PC

(57) ABSTRACT

A blocking device adapted in a blade server and a blade server are provided. The blade server includes a chassis and a plurality of blocking devices. The chassis includes an opening, a plurality of connecting interfaces and a plurality of convection holes. The connecting interfaces are placed in parallel to connect respective CPU blades. Each convection hole corresponds to a connecting interface. Each of the blocking devices corresponds to a convection hole and includes two blocking plates and a pushing object. The two blocking plates block the convection hole and include a hinge and a torsion spring. When a CPU blade is connected to the connecting interface, the pushing object displaces to make the two blocking plates rotate about a respective hinge to expose the convection hole. When the CPU blade is removed, the torsion springs make the two blocking plates rotate back to block the convection hole.

8 Claims, 5 Drawing Sheets

US 7,830,659 B2

BLOCKING DEVICE ADAPTED IN A BLADE SERVER AND BLADE SERVER

RELATED APPLICATIONS

This application claims priority to Taiwan Application Serial Number 97223196, filed Dec. 24, 2008, which is herein incorporated by reference.

BACKGROUND

1. Field of Invention

The present invention relates to a blocking device. More particularly, the present invention relates to a blocking device adapted in a convection hole formed on a chassis of a blade server.

2. Description of Related Art

Blade server is a more space-efficient server system than the conventional tower server. Thus, blade server replaces the conventional tower server and becomes the mainstream of the server technology. The chassis of the blade server comprises a plurality of connecting interfaces to connect to a plurality of CPU blades. The sidewall of the chassis has a plurality of convection holes corresponding to each of the connecting interface for dissipating the heat generated by the CPU blades. When a connecting interface has no CPU blade connected, a dummy blade is still needed to be placed on the connecting interface to block the convection hole. If the convection hole is exposed, the airflow convection in the chassis becomes imbalanced and further affects the heat dissipation of other CPU blades in the chassis. However, the dummy blade makes the cost of the blade server system increase.

Accordingly, what is needed is a blade server and a blocking device adapted in the blade server to prevent the imbalance of the airflow when the CPU blade is absent. The present invention addresses such a need.

SUMMARY

A blocking device adapted in a convection hole formed on a chassis of a blade server is provided. The convection hole is corresponding to a connecting interface of the chassis. The blocking device comprises: two blocking plates and a pushing means. The two blocking plates are placed next to each other to block the convection hole. Each blocking plate further comprises a hinge and a torsion spring. When a CPU blade is connected to the connecting interface, the pushing means displaces to push the central part of the two blocking plates such that each of the two blocking plates rotates about the hinge to expose the convection hole. When the CPU blade is removed from the connecting interface, the torsion springs make the two blocking plates rotate back to block the convection hole.

The blade server comprises a chassis and a plurality of blocking devices. The chassis comprises an opening, a plurality of connecting interfaces and a plurality of convection holes. The connecting interfaces are placed in parallel on the bottom side of the chassis to connect a CPU blade respectively. The convection holes are placed on a sidewall of the chassis each corresponding to a connecting interface. Each of the blocking devices is corresponding to a convection hole, wherein each of the blocking devices comprises two blocking plates and a pushing means. The two blocking plates are placed next to each other to block the convection hole. Each blocking plates further comprises a hinge and a torsion spring. When a CPU blade is connected to the connecting interface, the pushing means displaces to push the central part of the two blocking plates such that each of the two blocking plates rotates about the hinge to expose the convection hole. When the CPU blade is removed from the connecting interface, the torsion springs make the two blocking plates rotate back to block the convection hole.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
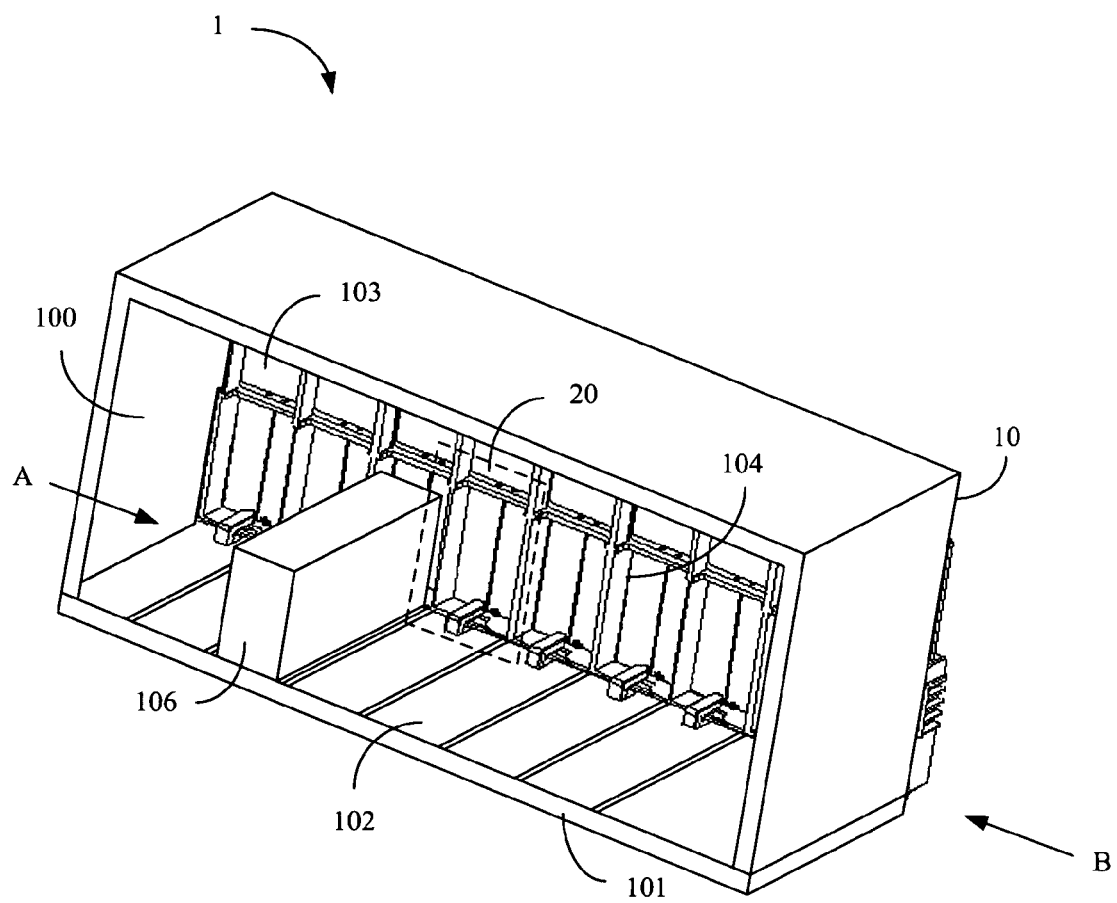
FIG. 1 is a blade server 1 of the first embodiment of the present invention.

Reference will now be made in detail to the present embodiments of the invention, examples of which are illustrated in the accompanying drawings. Wherever possible, the same reference numbers are used in the drawings and the description to refer to the same or like parts.

Figure 2A:
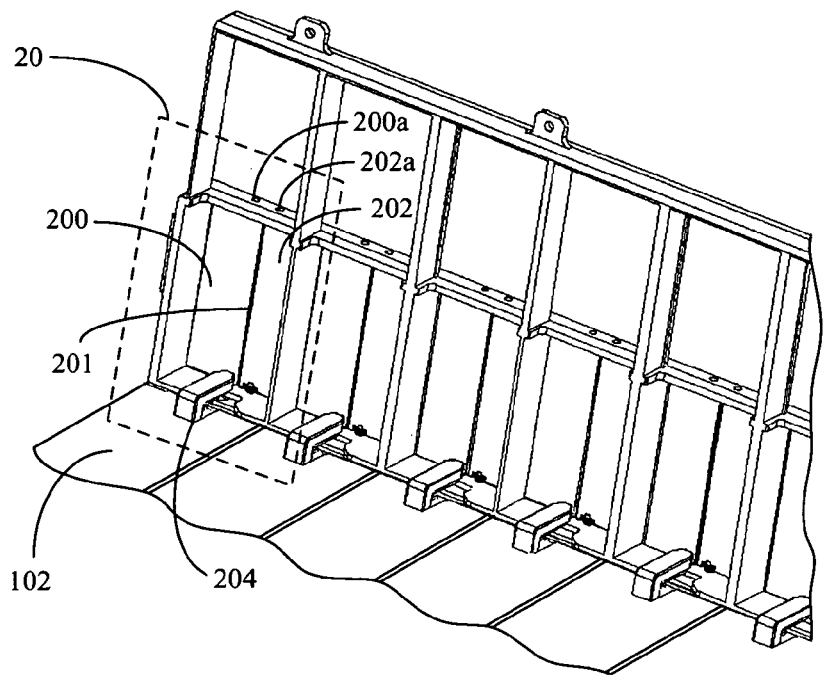
FIG. 2A is a diagram of the blocking devices from the view along the direction A in FIG. 1.
Figure 2B:
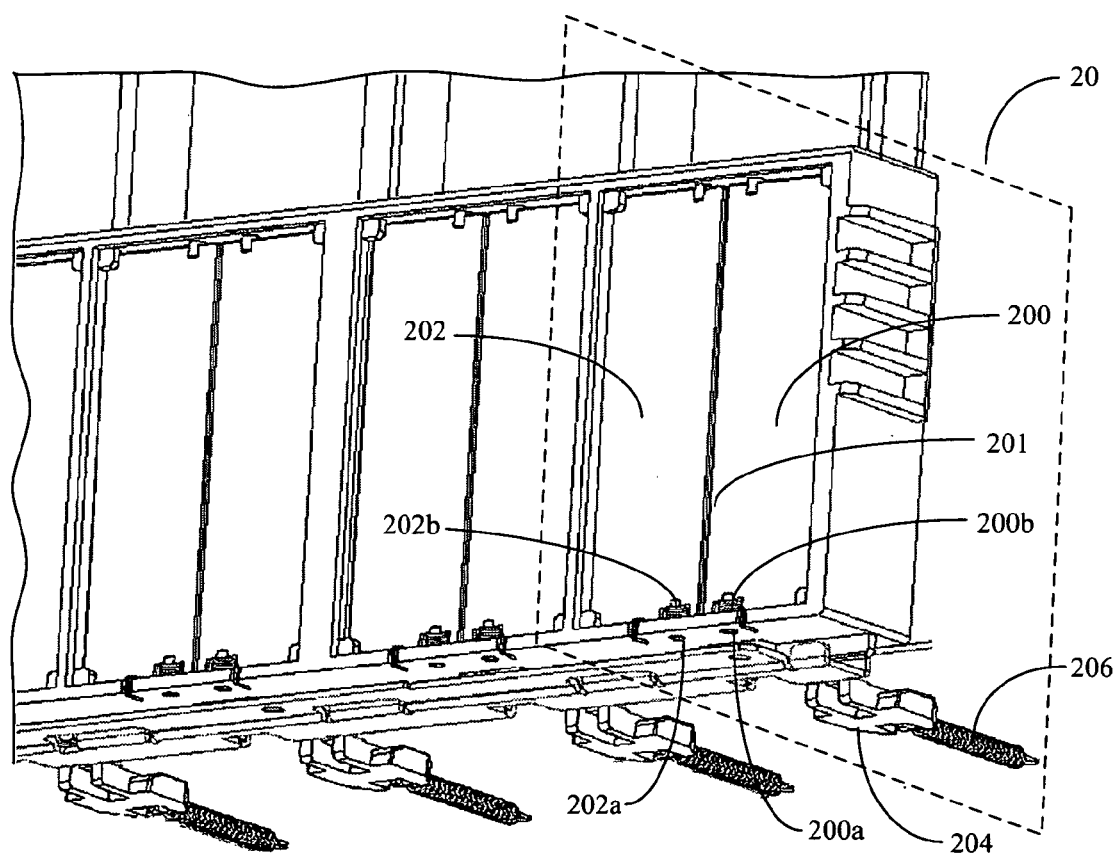
FIG. 2B is a diagram of the blocking devices from the view along the direction B opposite to the direction A in FIG. 1.
Figure 2C:
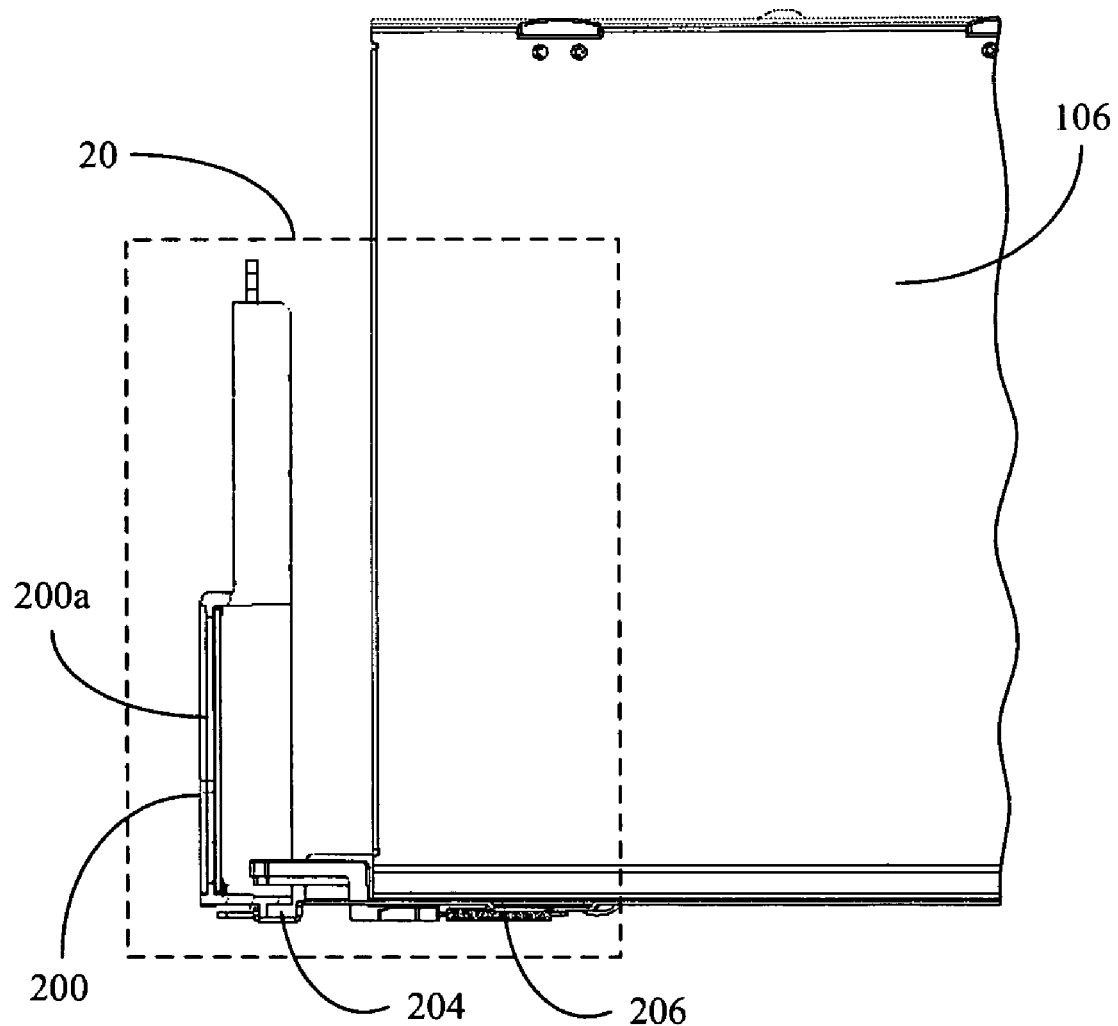
FIG. 2C is a side view of the blocking device of the first embodiment of the present invention.

Please refer to FIG. 1. FIG. 1 is a blade server 1 of the first embodiment of the present invention. The blade server 1 comprises a chassis 10 and a plurality of blocking devices 20 (not depicted in FIG. 1). The chassis 10 comprises an opening 100, a plurality of connecting interfaces 102 and a plurality of convection holes 104. The connecting interfaces 102 are placed in parallel on the bottom side 101 of the chassis 10 to connect a CPU blade 106 respectively. The convection holes 104 are placed on a sidewall 103 of the chassis 10 each corresponding to a connecting interface 102. As depicted in FIG. 1, each of the blocking devices 20 is corresponding to a convection hole 104. Please refer FIG. 2A and FIG. 2B at the same time. FIG. 2A is a diagram of the blocking devices 20 from the view along the direction A in FIG. 1, and FIG. 2B is a diagram of the blocking devices 20 from the view along the direction B opposite to the direction A in FIG. 1. Each of the blocking devices 20 comprises two blocking plates 200, 202 and a pushing means 204. The two blocking plates 200 and 202 are placed next to each other to block the convection hole 104 when there is no CPU blade 106 placed on the corresponding connecting interface 102. The two blocking plates 200 and 202 can be metal, plastic or other appropriate material in different embodiments. Each blocking plates 200 and 202 further comprises a hinge 200a and 202a and a torsion spring 200b and 202b. Please refer to FIG. 2C, a side view of the blocking device 20 of the first embodiment of the present invention. The CPU blade 106 is not completely connected to the connecting interface 102. Thus, the pushing means 204 and the blocking plates 200 and 202 stay in the original positions.

Figure 3A:
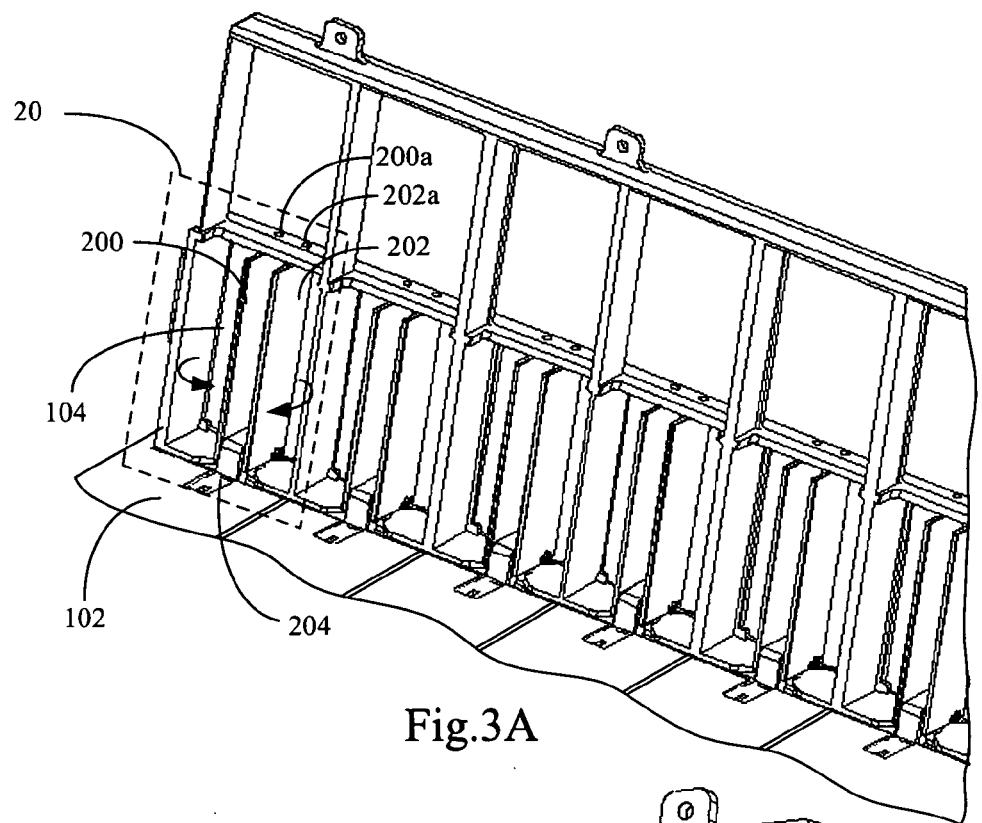
FIG. 3A is a diagram of the blocking devices from the view along the direction A in FIG. 1.
Figure 3B:
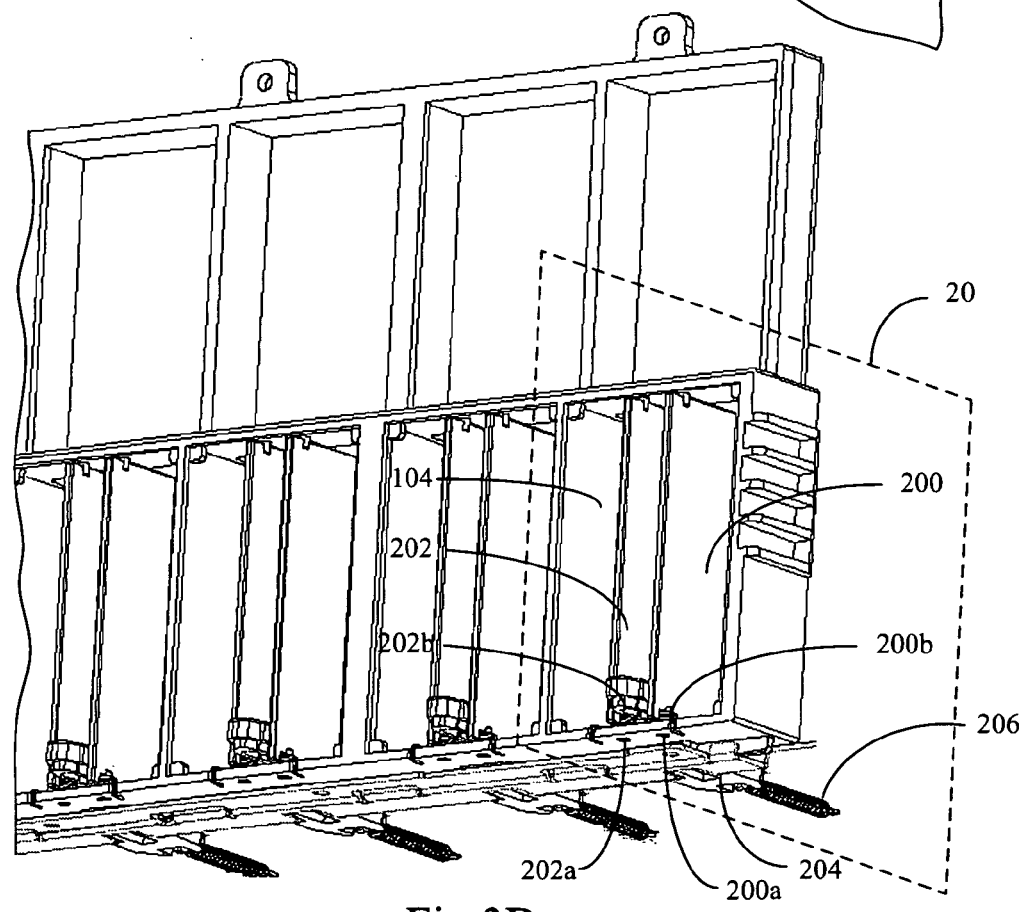
FIG. 3B is a diagram of the blocking devices from the view along the direction B opposite to the direction A in FIG. 1.

Please refer to FIG. 3A and FIG. 3B at the same time. FIG. 3A is a diagram of the blocking devices 20 from the view along the direction A in FIG. 1, and FIG. 3B is a diagram of the blocking devices 20 from the view along the direction B opposite to the direction A in FIG. 1.

Figure 3C:
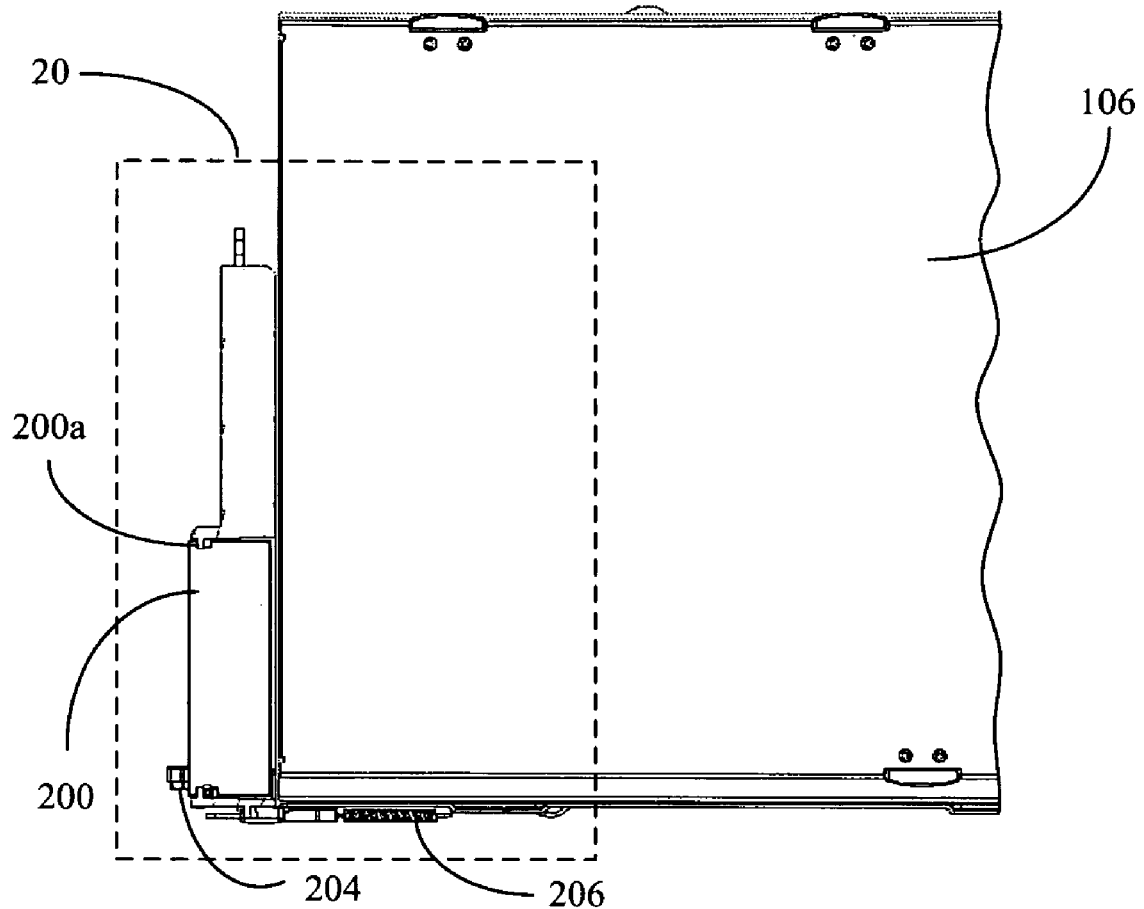
FIG. 3C is a side view of the blocking device of the first embodiment of the present invention.

When the CPU blade 106 (in order to illustrate the operation of the blocking device 20, the CPU blade 106 is not depicted in FIG. 3A and FIG. 3B) is connected to the connecting interface 102, the pushing means 204 displaces due to CPU blade 106 and pushes the central part 201 (depicted in FIG. 2A and FIG. 2B) of the two blocking plates 200 and 202 such that each of the two blocking plates 200 and 202 rotates about the hinge 200a and 202a to expose the convection hole 104. The exposure of the convection hole 104 makes the heat generated by the CPU blade 106 dissipates through the convection hole 104. Please refer to FIG. 3C, a side view of the blocking device 20 of the first embodiment of the present invention. According to FIG. 3C, the CPU blade 106 is connected to the connecting interface 102. The pushing means 204 displaces due to the CPU blade 106 and stretches out of the convection hole 104 such that each of the two blocking plates 200 and 202 rotates to expose the convection hole 104. When the CPU blade 106 is removed from the connecting interface 102, the torsion springs 200b and 202b make the two blocking plates 200 and 202 rotate back to block the convection hole 104. In the present embodiment, the blocking device 20 further comprises a reciprocal spring 206 connected to the pushing means 204. When the CPU blade 106 is removed from the connecting interface 102, the reciprocal spring 206 pulls the pushing means 204 backward and makes the two blocking plates 200 and 202 rotate back together with the torsion springs 200b and 202b to block the convection hole 204.

The blade server of the present invention makes use of the blocking device having two rotatable blocking plates to expose the convection hole when the CPU blade is present to perform heat dissipation and blocks the convection hole when the CPU blade is absent to prevent the imbalance of the airflow.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A blocking device adapted in a convection hole formed on a chassis of a blade server, wherein the convection hole corresponds to a connecting interface of the chassis, the blocking device comprising:
    two blocking plates placed next to each other to block the convection hole, wherein each of the two blocking plates comprises a hinge and a torsion spring; and
    a pushing means,
    wherein, when a CPU blade is connected to the connecting interface, the pushing means displaces to push the central part of the two blocking plates such that the two blocking plates rotate about the respective hinges thereof to expose the convection hole, and
    wherein, when the CPU blade is removed from the connecting interface, the torsion springs make the two blocking plates rotate back to block the convection hole.

2. The blocking device of claim 1, further comprising a reciprocal spring connected to the pushing means, when the CPU blade is removed from the connecting interface, the reciprocal spring pulls the pushing means backward and makes the two blocking plates rotate back together with the torsion springs to block the convection hole.

3. The blocking device of claim 1, wherein the two blocking plates are two metal plates.

4. The blocking device of claim 1, wherein the two blocking plates are two plastic plates.

5. A blade server, comprising:
    a chassis comprised of:
        an opening;
        a plurality of connecting interfaces placed in parallel on the bottom side of the chassis to connect one CPU blade of a plurality of CPU blades thereto respectively; and
        a plurality of convection holes placed on a sidewall of the chassis, each convection hole of the plurality of convection holes corresponding to one connecting interface of the plurality of connecting interfaces;
    a plurality of blocking devices, each blocking device of the plurality of blocking devices corresponding to a respective convection hole of the plurality of convection holes and comprising:
        two blocking plates placed next to each other to block one respective convection hole of the plurality of convection holes, wherein each of the two blocking plates further comprises a hinge and a torsion spring; and
        a pushing means,
    wherein, when one CPU blade of the plurality of CPU blades is connected to a corresponding connecting interface of the plurality of connecting interfaces, the pushing means displaces to push the central part of the two blocking plates such that the two blocking plates rotate about the respective hinges thereof to expose a corresponding convection hole of the plurality convection holes, and
    wherein, when one of the CPU blades of the plurality of CPU blades is removed from the corresponding connecting interface of the plurality of connecting interfaces, the respective torsion springs make the two blocking plates rotate back to block the corresponding convection hole of the plurality of convection holes.

6. The blade server of claim 5, wherein each blocking device of the plurality of blocking devices further comprises a reciprocal spring connected to the pushing means, and wherein, when one of the CPU blades of the plurality of CPU blades is removed from the corresponding connecting interface of the plurality of connecting interfaces, the reciprocal spring pulls the pushing means backward and makes the two blocking plates rotate back together with the respective torsion springs to block the corresponding convection hole of the plurality of convection holes.

7. The blade server of claim 5, wherein the two blocking plates are two metal plates.

8. The blade server of claim 5, wherein the two blocking plates are two plastic plates.

* * * * *